(12) United States Patent
Gautier et al.

(10) Patent No.: US 6,441,392 B1
(45) Date of Patent: Aug. 27, 2002

(54) DEVICE BASED ON QUANTIC ISLANDS AND METHOD FOR MAKING SAME

(75) Inventors: Jacques Gautier, Coublevie; François Martin, Grenoble, both of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/403,786

(22) PCT Filed: May 4, 1998

(86) PCT No.: PCT/FR98/00889

§ 371 (c)(1),
(2), (4) Date: Nov. 5, 1999

(87) PCT Pub. No.: WO98/50958

PCT Pub. Date: Nov. 12, 1998

(30) Foreign Application Priority Data

May 5, 1997 (FR) .............................. 97 05506

(51) Int. Cl.[7] .................. H01L 29/06; H01L 31/0336; H01L 21/336
(52) U.S. Cl. .................. 257/12; 257/11; 257/14; 257/17; 257/22; 257/316; 257/321; 438/257; 438/264; 438/503; 438/507; 438/962
(58) Field of Search ............. 257/12, 11, 17, 257/20, 22, 24, 14, 321, 316; 438/257, 264, 503, 507, 962, 149, 22, 301

(56) References Cited

U.S. PATENT DOCUMENTS 5,714,766 A * 2/1998 Chen et al. .............. 257/17
5,731,598 A * 3/1998 Kado et al. .............. 257/30

FOREIGN PATENT DOCUMENTS

EP 0 750 353 12/1996

OTHER PUBLICATIONS

Patent Abstracts of Japan vol. 95, No. 11, Dec. 26, 1995, & JP 07 226522 A (Hitachi Ltd), Aug. 22, 1995, see abstract.

Kanuo Yano Et Al: "Room–Temperature Single–Electron Memory" IEEE Transactions on Electron Devices, vol. 41 No. 9, Sep. 1, 1994, pp. 1628–1638, XP000466806 cited in the application see the whole document.

Tiwari S Et Al: "A Silicon Nanocrystals Based Memory" Applied Physics Letters, vol. 68, No. 10, Mar. 4, 1996, pp. 1377–1379, XP000582303 cited in the application.

H. Sasaki Momose Et Al: "High–Frequency AC characteristics of 1.5nm gate oxide MOSFETs" International Electron Devices Meeting 1996 Technical Digest, 8 11 Dec. 1996, pp. 105–108, XP002052597, San Francisco, CA, US, cited in the application.

Coulomb blockade at 77k in nanoscale metallic islands in a lateral nanostructure article by W. Chen et al, Received Dec. 5, 1994, accepted for publication Mar. 24, 1995.

\* cited by examiner

*Primary Examiner*—Matthew Smith
*Assistant Examiner*—Igwe U Anya
(74) *Attorney, Agent, or Firm*—Oblon, Spivak, McClelland, Maier & Neustadt, P.C.

(57) ABSTRACT

A quantic effect device which functions using a Coulomb blockade phenomenon. The device includes two electron reservoirs, two sets of islands that are separated by a dielectric layer, a protective insulating layer and a control electrode.

13 Claims, 1 Drawing Sheet

DEVICE BASED ON QUANTIC ISLANDS AND METHOD FOR MAKING SAME

BACKGROUND OF THE INVENTION

1. Field of the invention

The technical domain concerned by this invention relates to quantic effect devices making use of a Coulomb blockade phenomenon. In particular, it is aimed at memory and logical applications of very high density integrated circuits made on a silicon substrate.

2. Discussion of the Background

For example, the principle and feasibility of this type of device are described in the article by K. Yano et al entitled "Room-Temperature Single Electron Memory" published in IEEE Transactions on Electron Devices, vol 41, No. 9, p 1628–1638, 1994.

The Coulomb blockade phenomenon occurs in conducting islands that are dielectrically insulated from their environment and slightly coupled to it by a tunnel effect. The use of this phenomenon at temperatures close to ambient temperature requires that the total capacitance of each island is of the order of one atto farad which, together with the existence of a tunnel current that is not too low, imposes that the dimensions of the islands must be of the order of one nanometer.

Conducting islands with a characteristic dimension exceeding 10 nm have already been manufactured using conventional lithoetching processes at their limits. However, the scale of a few nanometers cannot be achieved with the current resolution of this type of process.

One solution used consists of making a granular deposition of the conducting material on an insulating layer, for example using a CVD technique or by evaporation; for example, this is described in the article by W. Chen et al. entitled "Coulomb blockade at 77K in nanoscale metallic islands in a lateral nanostructure" published in Applied Physics Letters, vol. 66, No. 24, p 3383–3384, 1995.

The area in which the islands will finally be located (wire or rectangle) may be delimited by a lithoetching process (for example lift off). The structure obtained is shown diagrammatically in FIG. 1. In this figure, references 2 and 4 denote two electron reservoirs (for example source and drain of a transistor) between which the nanometric islands 6 are distributed.

The major disadvantage of this approach is that the islands 6 are located at random, which gives strong dispersion of tunnel current levels in different islands. The global current between two electrodes placed on each side of an area of islands is then extremely sensitive to the density of islands, and the characteristics of this current are very dispersed in different samples.

SUMMARY OF THE INVENTION

The purpose of this invention is to manufacture a set of islands capable of improving the uniformity of the characteristics, and particularly the current, compared with sets of islands obtained by conventional processes.

The purpose of the invention is a quantic effect device that operates making use of the Coulomb blockade phenomenon, comprising:
  a first and a second electron reservoir,
  at least one first and one second set of islands separated by a dielectric layer,
  a protective insulating layer and a control grid.

Another purpose of the invention is a transistor comprising a source, a drain and a grid, and a channel connecting the source and the drain, a first and a second set of islands separated from each other by a dielectric layer, the said islands being distributed between the channel and the grid, a protective insulating layer covering the two sets of islands.

Consequently, according to the invention, the space between grains is partially filled by covering them with an insulating layer (or a tunnel insulating layer which fixes the current level (tunnel effect)), preferably uniform and with a controlled thickness, and the remaining space is filled by a second deposition of grains. Therefore, successive depositions of islands only form one layer of islands.

If the distance between the first grains, covered by the tunnel insulating layer, is of the same order of magnitude as the grain size, two successive depositions of grains are sufficient to obtain satisfactorily uniform electrical properties.

If the distance between grains is greater than the grain size, several successive depositions of grains may be made, each being covered by a tunnel insulating layer (except for the last layer of grains). Preferably, the various tunnel insulating layers are of the same thickness.

Therefore the invention relates to a microelectronic device comprising a source and a drain, and n successive layers of islands or grains, where $n \geq 2$, each layer (except for the last) being covered by a tunnel insulating layer. A dielectric layer and a grid control this microelectronic device.

The invention can improve the electrical characteristics of conducting islands or grains located between reservoirs of electrons in the quantic effect device, or between the source and drain of the transistor or the microelectronic device.

The proposed invention can improve the uniformity of the thickness of the dielectric separating the islands and therefore the uniformity of the tunnel current, although the positioning of the islands is still random.

In a quantic effect device according to the invention, the level of the current tunnel varies exponentially with the thickness of the barrier concerned. Making the dielectric surrounding the islands uniform can improve the tunnel current.

Therefore the structure according to the invention (quantic effect device operating based on the Coulomb blockade phenomenon, or a transistor or microelectronic device) comprises a set of islands or grains separated from each other by an insulation, preferably with good control over the thickness, which improves the uniformity of the tunnel current between grains. Good uniformity of the tunnel current is obtained if the thickness of the insulation is controlled.

Another purpose of the invention is a memory device comprising a device or transistor like that described above.

Another purpose of the invention is a process for making a microelectronic device or a transistor or a quantic effect device that operates making use of a Coulomb blockade phenomenon, or a memory device comprising the following steps:
  a) formation of a first and a second electron reservoir,
  b) formation of a first set of conducting grains or islands,
  c) formation of a dielectric layer above the first set of grains or islands,
  d) formation of another set of conducting islands or grains, above the dielectric layer.

Steps c) and d) may be repeated N times.

The assembly can then be covered with a protective insulating layer and a control grid.

BRIEF DESCRIPTION OF THE DRAWINGS

In any case, the characteristics and advantages of the invention will become clearer after reading the following description. This description relates to example embodiments given for explanatory purposes only and in no way limitative, with reference to the attached drawings on which.

DETAILED DESCRIPTION OF THE PREFERRED EMBODIMENTS

Figure 1:
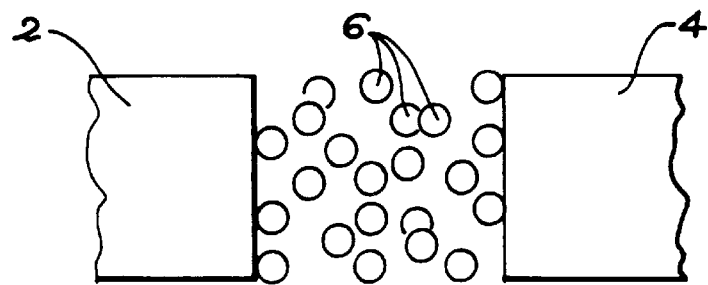
FIG. 1 diagrammatically shows a structure made according to prior art.
Figure 2:
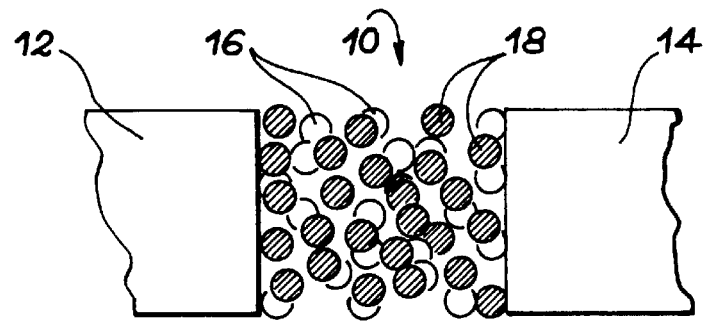
FIGS. 2 and 3 show top and side views of devices according to the invention.

FIG. 2 shows a top view of a device according to this invention.

References 12 and 14 denote a first and a second reservoir of electrons in a quantic effect device 10, that operates making use of a the Coulomb blockade phenomenon. For example, these reservoirs form the drain and source of a transistor type structure or a microelectronic device.

Between these two elements there is a set of conducting islands or grains, 16, 18. The size of these is preferably about one nanometer (for example between 1 and 10 nm or between 1 and 5 nm). This set of islands or grains is actually composed of a first subset 16 and a second subset 18, separated by a dielectric layer.

Therefore, inter-island spaces are statistically either filled or reduced between one deposition and the next.

In fact, the space between the islands 16 or the grains in the first subset is partially filled by covering them with an insulating layer, and then the remaining space is filled by a second deposition of islands 18 or grains.

The insulating or dielectric layer may be obtained by any appropriate technique depending on the nature of the conducting material; for example, it may be oxidation of the conducting material or nitridation or a deposition of an insulating material.

Preferably, the insulation thickness is determined as a function of the following criteria:
- thickness sufficiently small so that the tunnel current is sufficiently high,
- equivalent tunnel resistance of this insulating layer less than the value $h/e^2 = 25\ k\Omega$,
- connecting capacitance (the capacitance of the structure depends on the grain area and the insulation thickness) as low as possible to be able to operate at a temperature close to the normal temperature. For example, if the diameter of the islands or grains is of the order of a few nanometers, an attempt will be made to obtain a capacitance with respect to the environment of between 0.1 atto Farad and a few atto Farads (for example 1 atto Farad).

The thickness of the tunnel insulation may be between 0.7 nm and 3 nm (for example 1 nm).

The final thickness of the dielectric between islands or between grains is defined by the thickness of the thin insulating layer, which is more uniform than the distance between islands or between grains. The result is improved uniformity of the tunnel current.

The number of layers of granular deposition is a variable parameter. This number may depend on the density and size of islands. For example, if the distance between grains is greater than the grain size, several successive depositions (for example 3 or 4, etc.) of grains each covered by a tunnel insulating layer can be used to give good coverage of the space between electrodes 12, 14.

Figure 3:
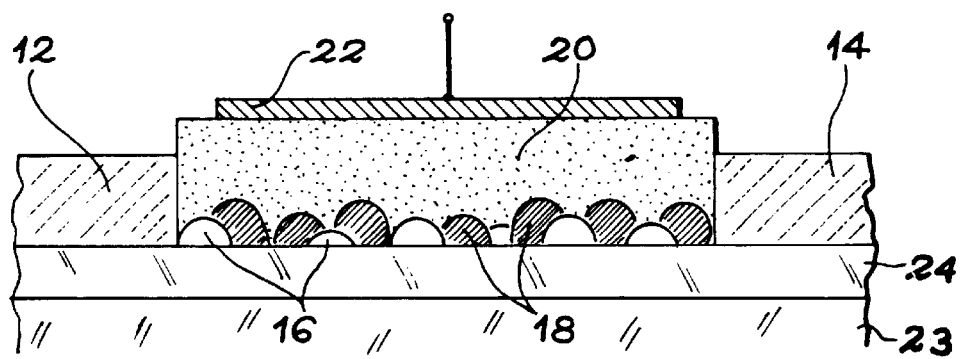

As illustrated in FIG. 3, the set of islands or grains can then be covered by a dielectric layer 20 and a control grid 22.

For example, this type of device operates in the manner described in the article by K. Yano et al., already mentioned in the introduction to this application. Application of a particular potential $V_g$ (defined by the different capacitances involved in the system) can transfer an electron from the channel formed between the electron reservoirs 12, 14, to a conducting island or grain, by the tunnel effect. This transfer is demonstrated by a variation in the drain current. The existence of a hysteresis phenomenon in the capture of a single electron creates a memory effect in the elementary cell thus formed. Therefore, the device according to the invention may be combined, for example, with means of controlling the grid voltage and means of reading the drain current.

A process for embodiment of a device according to the invention comprises firstly formation of the electrodes or electron reservoirs 12, 14, and then the formation of a first set of conducting grains or islands 16. For example, this can be done by thin granular depositions of amorphous silicon (with average grain diameters 3 nm) and then by heat treatment as described in the article by K. Yano already mentioned above, or in the article by S. Tiwari et al. entitled "Silicon nanocristals based memory" published in Applied Physics Letters, vol. 68, No. 10, pages 1377–1379, 1996.

The dielectric separation layer may then be made by a partial thermal oxidation, as described in the article by H. Sasaki Momose et al., entitled "High-frequency AC Characteristics of 1.5 nm Gate oxide MOSFETs", published in IEEE International Electron Devices Meeting, pages 105–108, 1996.

A second thin granular deposition of polycrystalline silicon is then made.

These deposition and oxidation steps may be repeated a number of times. A dielectric layer 20 is then formed and a control grid 22 is made.

These various steps are made on an initial substrate 23 covered by dielectric 24 (for example made of $Si_3N_4$). A thick layer of strongly doped polycrystalline silicon is then deposited. The electrodes 12, 14 are made by photolithography, etching this polycrystalline silicon layer and removal of the resin.

Consequently, according to the invention, at least two granular conducting material deposition steps are carried out in sequence: thus, statistically spaces between islands are either filled in or reduced, between different deposits.

Therefore, the invention can improve the uniformity of the electrical characteristics of a set of conducting islands located between the source and drain of microelectronic devices. These characteristics are improved, despite irregular positioning of the grains or islands.

What is claimed is:

1. Quantic effect device, that operates making use of a Coulomb blockade phenomenon, comprising:
   a first and a second electron reservoirs,
   a conducting channel located between the first and second electron reservoirs, said conducting channel comprising a first subset of conducting islands, wherein a space between said conducting islands of said first subset is partially filled by covering said conducting islands with a tunnel insulating layer, and a remaining space not filled by said tunnel insulating layer is filled by a second subset of conducting islands so that said first subset and second subset of conducting islands form only one layer of conducting islands;

a protective insulating layer covering the layer of conducting islands; and a control electrode covering the insulating layer.

2. Quantic effect device according to claim 1, characterized in that the first reservoir, the second reservoir (14) and the control electrode are the source, drain and grid of the same transistor, respectively.

3. Quantic effect device according to claim 2, characterized in that it comprises N (N>2) successive sets of islands, each set (except for the last) being separated from the next by a dielectric tunnel insulating layer.

4. Memory device comprising a quantic effect device, characterized in that the quantic effect device is a device according to claim 2.

5. Quantic effect device according to claim 1, characterized in that it comprises N (N>2) successive sets of islands, each set (except for the last) being separated from the next by a dielectric tunnel insulating layer.

6. Memory device comprising a quantic effect device, characterized in that the quantic effect device is a device according to claim 5.

7. Memory device comprising a quantic effect device, characterized in that the quantic effect device is a device according to claim 1.

8. Memory device according to claim 7, characterized in that it comprises means of controlling a voltage applied to the control electrode and means of measuring a current passing through the electron reservoirs.

9. Process for making a quantic effect device or a microelectric device, comprising the following steps:
   a) forming a first and a second electron reservoirs,
   b) forming a conducting channel located between the first and second electron reservoirs, said conducting channel comprising a first subset of conducting islands,
   c) forming a tunnel insulating layer above the first subset of conducting islands to partially fill space between conducting islands; and
   d) forming a second subset of conducting islands above the tunnel insulating layer, so that a remaining space not filled by said tunnel insulating layer is filled by the conducting islands of the second subset, said first subset and second subset of conducting islands forming only one layer of conducting islands.

10. Process according to claim 9 characterized in that the first and second electron reservoirs are the source and the drain respectively, of the same transistor.

11. Process according to claim 10, wherein the steps of forming said tunnel insulating layer and forming said second subset are repeated N times.

12. Process according to claim 9, wherein the steps of forming said tunnel insulating layer and forming said second subset are repeated N times.

13. Process according to claim 9, also including the creation of a protective insulating layer and a control grid.

* * * * *